(12) United States Patent
Asano

(10) Patent No.: US 7,944,567 B2
(45) Date of Patent: May 17, 2011

(54) SEMICONDUCTOR LIGHT EMITTING ELEMENT, LIGHT SOURCE USING THE SEMICONDUCTOR LIGHT EMITTING ELEMENT, AND OPTICAL TOMOGRAPHY IMAGING APPARATUS

(75) Inventor: Hideki Asano, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 1197 days.

(21) Appl. No.: 11/633,473

(22) Filed: Dec. 5, 2006

(65) Prior Publication Data

US 2010/0259758 A1 Oct. 14, 2010

(30) Foreign Application Priority Data

Dec. 5, 2005 (JP) ................... 2005-350158

(51) Int. Cl.
*G01B 11/02* (2006.01)
*H01S 5/00* (2006.01)
(52) U.S. Cl. ..................... 356/497; 372/44.01
(58) Field of Classification Search ............... 250/208.1; 257/91, 99; 372/43.01, 44.01; 356/497; 385/8, 122
See application file for complete search history.

(56) References Cited

U.S. PATENT DOCUMENTS

| | | | | |
|---|---|---|---|---|
| 4,567,374 A | * | 1/1986 | Takenouchi et al. | 250/208.1 |
| 4,886,977 A | * | 12/1989 | Gofuku et al. | 250/208.1 |
| 5,283,799 A | * | 2/1994 | Jacquet et al. | 372/50.22 |
| 5,642,371 A | * | 6/1997 | Tohyama et al. | 372/45.01 |
| 6,104,850 A | * | 8/2000 | Dong | 385/29 |
| 6,184,542 B1 | * | 2/2001 | Alphonse | 257/94 |
| 6,526,075 B2 | * | 2/2003 | Mizutani | 372/27 |
| 6,757,499 B1 | * | 6/2004 | Aoki | 398/182 |
| 6,927,412 B2 | * | 8/2005 | Takahashi et al. | 257/13 |
| 6,987,784 B2 | * | 1/2006 | Woodley et al. | 372/20 |
| 7,019,838 B2 | * | 3/2006 | Izatt et al. | 356/479 |
| 7,274,010 B2 | * | 9/2007 | Matsuda et al. | 250/214 LA |
| 7,485,892 B2 | * | 2/2009 | Ooi et al. | 257/14 |

FOREIGN PATENT DOCUMENTS

JP 6-196809 A 7/1994

OTHER PUBLICATIONS

M. Takeda, "Optical Frequency Scanning Interference Microscopes", Optics Engineering Contact, vol. 41, No. 7, pp. 426-432, 2003.

* cited by examiner

*Primary Examiner* — Gregory J Toatley
*Assistant Examiner* — Scott M Richey
(74) *Attorney, Agent, or Firm* — Sughrue Mion, PLLC

(57) ABSTRACT

A semiconductor light emitting element is equipped with a layered structure including an active layer, and electrode layers at the upper and lower surfaces thereof. At least one of the upper and lower electrode layers is divided into at least two electrodes, which are separated in the wave guiding direction of light. The active layer is structured to have different gain wavelengths along the wave guiding direction, to emit light having different spectra from each region corresponding to each of the at least two electrodes. The spectral distribution of output light is enabled to be varied by individually varying the current injected by each of the at least two divided electrodes.

16 Claims, 5 Drawing Sheets

SEMICONDUCTOR LIGHT EMITTING ELEMENT, LIGHT SOURCE USING THE SEMICONDUCTOR LIGHT EMITTING ELEMENT, AND OPTICAL TOMOGRAPHY IMAGING APPARATUS

BACKGROUND OF THE INVENTION

1. Field of the Invention

The present invention relates to a semiconductor light emitting element, and particularly to a semiconductor light emitting element capable of controlling spectral distribution.

The present invention also relates to a light source apparatus equipped with a semiconductor light emitting element.

The present invention further relates to an optical tomography imaging apparatus.

2. Description of the Related Art

Recently, demand has been growing for low cost multiple wavelength light sources in the fields of optical communications, measurement, and medicine, in which diagnosis and the like are performed using light. A light source for OCT (Optical Coherence Tomography), which is in use for wavelength inspection in optical communications, fiber gyros, OTDR measurement, and opthalmology, is a specific example of such a light source. It is expected that SLD's (Super Luminescent Diodes), which have a high probability of becoming capable of being produced at low cost, will serve as this type of multiple wavelength light source.

SLD's emit light that exhibits incoherent properties, which are similar to those of light emitted by regular light emitting diodes. SLD's emit light which has a broad bandwidth spectral distribution and are capable of light output of 1 mW or greater, similar to semiconductor lasers. Similar to semiconductor lasers, SLD's are equipped with a mechanism in which naturally discharged light, generated by recombination of injected carriers, is amplified while propagating toward a light emitting facet by high gain stimulated emission, then emitted from the light emitting facet.

There are known semiconductor light emitting elements, such as SLD's, having active layers structured to generate light having different gain wavelengths along directions in which waveguide paths extend. The structuring of the active layers in such a mariner is a method by which spectral distributions over broader bandwidths (across broader wavelength ranges) can be obtained. For example, Japanese Unexamined Patent Publication No. 6(1994)-196809 discloses a technique that utilizes selective growth to modulate the thickness of a quantum well active layer along a wave guiding direction of light. In this technique, two parallel stripe shaped $SiO_2$ masks are formed on a layer surface with a constant interval therebetween. The film thickness and the composition of the active layer are changed in the axial direction of a cavity by changing the mask widths. Japanese Unexamined Patent Publication No. 6 (1994)-196809 suggests that the film thickness of only desired layers can be modulated, by alternately employing an atomic layer epitaxy mode and a standard mode, in the case that metal organic vapor phase epitaxy is employed.

An SLD produced employing the above technique, having a structure that generates light having different gain wavelengths along a wave guiding direction can obtain a broader bandwidth spectral distribution, compared to a standard SLD that generates light having a single gain wavelength. On the other hand, the spectral distribution of such an SLD is not a Gaussian distribution, and becomes that which has asymmetrical convexities and concavities (refer to curve B in the graph of FIG. 3).

It is important for light to be employed for measurement that utilizes light interference, such as OCT, to have a spectral distribution that approximates a Gaussian distribution. Therefore, in the case that an SLD produced by the aforementioned technique is employed as the light source for such a measuring apparatus, it becomes necessary to provide an optical filter for shaping the spectral distribution of emitted light into a Gaussian distribution.

Broad bandwidth spectral distributions are also desired in variable wavelength lasers equipped with semiconductor light emitting elements. Use of an SLD having a broad bandwidth gain wavelength structure produced by the aforementioned technique may be considered for this application. In addition to being able to emit light over a broad bandwidth, it is important for variable wavelength laser light sources to have uniform output across the broad bandwidth. Therefore, it becomes necessary to provide an optical filter that uniformizes light output across a variable output region.

In both light sources equipped with the aforementioned semiconductor light emitting element, it becomes necessary to further provide an optical filter for each semiconductor light emitting element, in order to shape the spectral distribution thereof to a desired spectral distribution. Therefore, the optical filters need to be designed and produced, thereby increasing the cost of the light sources.

SUMMARY OF THE INVENTION

The present invention has been developed in view of the foregoing circumstances. It is an object of the present invention to provide a semiconductor light emitting element capable of controlling the spectral distribution of light emitted thereby.

It is another object of the present invention to provide a light source apparatus capable of obtaining desired spectral distributions, having a simple structure.

It is still another object of the present invention to provide an optical tomography apparatus capable of obtaining favorable optical tomographic images.

A semiconductor light emitting element of the present invention comprises:

a layered structure that includes an active layer;

an upper electrode layer on the upper surface of the layered structure; and a lower electrode layer on the lower surface of the layered structure; wherein:

at least one of the upper electrode layer and the lower electrode layer is divided into at least two electrodes, which are separated in a wave guiding direction of light;

the active layer is structured to have different gain wavelengths along the wave guiding direction, to emit light having different spectra from each region corresponding to each of the at least two electrodes; and the spectral distribution of output light is enabled to be varied by individually varying the current injected by each of the at least two divided electrodes.

The phrase "structures having different gain wavelengths along the wave guiding direction" specifically refers to structures in which the thickness of the active layer changes along the wave guiding direction of light and/or structures in which the composition of the active layer changes along the wave guiding direction of light. Note that the structures having different gain wavelengths may be configured such that the gain wavelengths become shorter along the wave guiding direction toward the light emitting facet.

The at least two separate electrodes may be provided such that they correspond to regions that generate light having different gain wavelengths from each other, in order for the semiconductor light emitting element to "emit light having different spectra from each region".

The semiconductor light emitting element of the present invention may be employed either as a super luminescent diode or an optical amplifier.

A light source apparatus of the present invention comprises:

the semiconductor light emitting element of the present invention; and drive means, which is capable of individually adjusting the current to be injected by each of the at least two divided electrodes of the semiconductor light emitting element.

The drive means may comprise: a power source for driving the semiconductor light emitting element; and at least two variable resistors, each of which is connected to each of the at least two divided electrodes, connected in parallel to the power source. Alternatively, a separate power source and a variable resistor may be provided for each of the at least two electrodes.

The light source apparatus of the present invention may be employed as a variable wavelength laser, by further comprising:

wavelength selecting means that selectively returns a portion of the wavelength of light output from the semiconductor light emitting element to the semiconductor light emitting element. In this case, the wavelength selecting means may be a wavelength sweeping means that selectively returns a portion of the wavelength of light output from the semiconductor light emitting element to the semiconductor light emitting element while continuously varying the wavelength at a predetermined period.

An optical tomography imaging apparatus of the present invention comprises:

a light source apparatus of the present invention;

light dividing means, for dividing laser light emitted by the light source apparatus into a measuring light beam and a reference light beam;

multiplexing means, for multiplexing a reflected light beam, which is the measuring light beam reflected by a measurement target when the measuring light beam is irradiated onto the measurement target, and the reference light beam;

coherent light detecting means, for detecting the intensity of the reflected light beam at a plurality of depth positions of the measurement target, based on the frequency and the optical intensity of a coherent light beam obtained by multiplexing the reflected light beam and the reference light beam; and image obtaining means, for obtaining tomographic images of the measurement target, based on the intensities of the reflected light beam at each of the depth positions detected by the coherent light detecting means.

In the semiconductor light emitting element of the present invention, the active layer is structured to have different gain wavelengths along the wave guiding direction, and at least one of the upper electrode layer and the lower electrode layer is divided into at least two electrodes, which are separated in the wave guiding direction of light. Therefore, the current injected by each electrode is capable of being controlled independently. Because the active layer is structured to modulate gain wavelengths, broad bandwidth spectral properties can be obtained. In addition, because the amounts and ratios of current injected by each electrode can be varied, the spectral distribution of emitted light can be controlled to be of desired shapes.

The light source apparatus of the present invention is equipped with the semiconductor light emitting element of the present invention. Therefore, the spectral shape of light emitted thereby can be controlled to be of desired shapes without providing a specialized optical filter. Accordingly, high quality light source apparatuses can be provided at low cost and high yields.

In addition, the light source apparatus of the present invention comprises a semiconductor light emitting element which has broad bandwidth spectral properties, is capable of controlling the spectral distribution of emitted light to be of desired shapes, and is capable of obtaining spectral distributions of substantially uniform optical intensities across a broad wavelength band. Therefore, output light having substantially uniform optical intensities can be obtained across a broad wavelength band, in the case that the light source apparatus is employed as a variable wavelength laser.

The optical tomography imaging apparatus of the present invention obtains tomographic images employing laser light emitted by a light source apparatus that operates as a variable wavelength laser capable of obtaining substantially uniform optical intensities for various wavelengths. Therefore, favorable tomographic images can be obtained.

BEST MODE FOR CARRYING OUT THE INVENTION

Hereinafter, embodiments of the present invention will be described with reference to the drawings. FIGS. 1A through 1F are perspective views that illustrate the layer structure and the method for producing a semiconductor light emitting element 1 according to a first embodiment of the present invention.

Figure 1A:
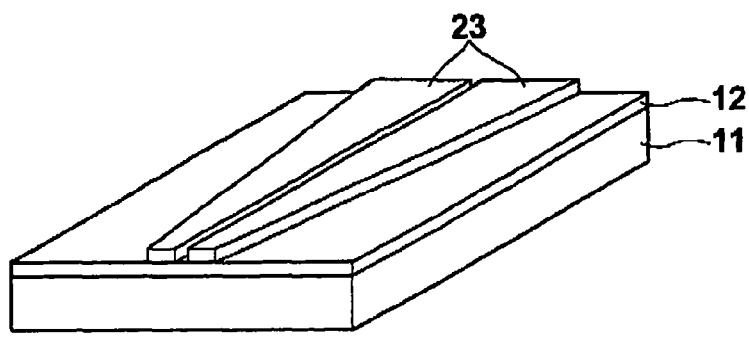
FIG. 1A is a first perspective view that illustrates a manufacturing step of a semiconductor light emitting element according to a first embodiment of the present invention.
Figure 1B:
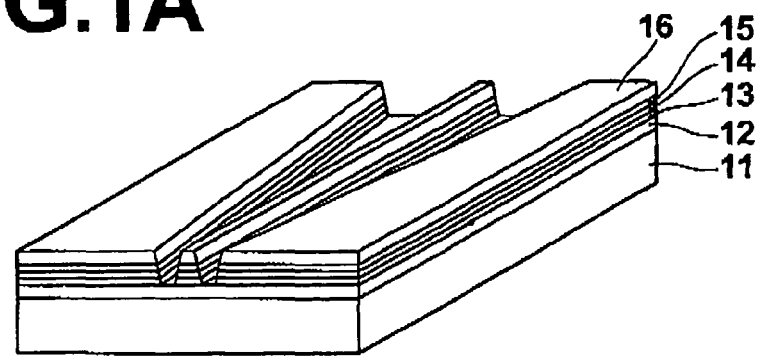
FIG. 1B is a second perspective view that illustrates a manufacturing step of the semiconductor light emitting element according to the first embodiment of the present invention.
Figure 1C:
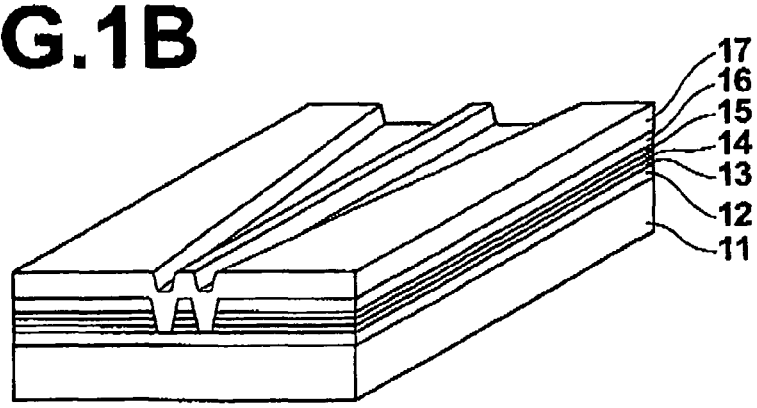
FIG. 1C is a third perspective view that illustrates a manufacturing step of the semiconductor light emitting element according to the first embodiment of the present invention.
Figure 1D:
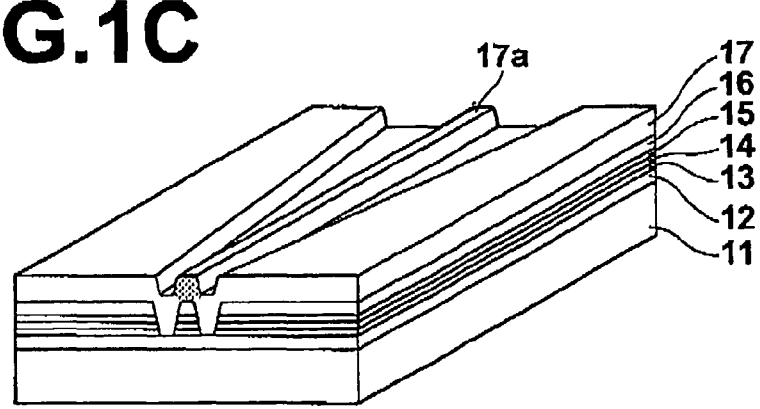
FIG. 1D is a fourth perspective view that illustrates a manufacturing step of the semiconductor light emitting element according to the first embodiment of the present invention.
Figure 1E:
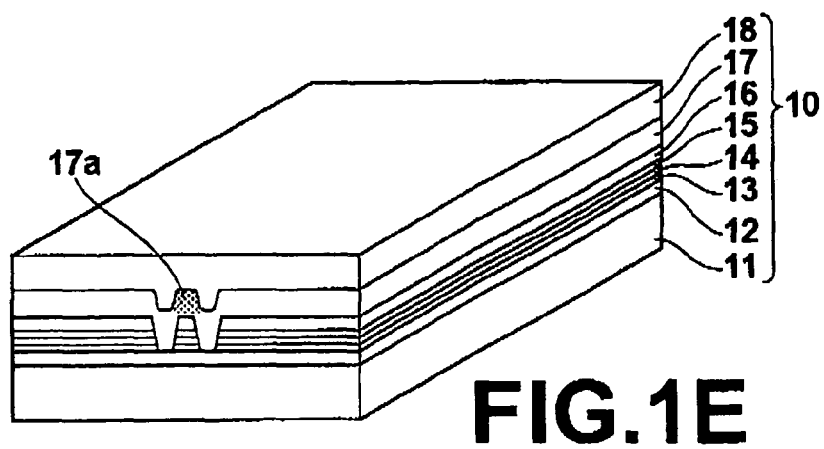
FIG. 1E is a fifth perspective view that illustrates a manufacturing step of the semiconductor light emitting element according to the first embodiment of the present invention.
Figure 1F:
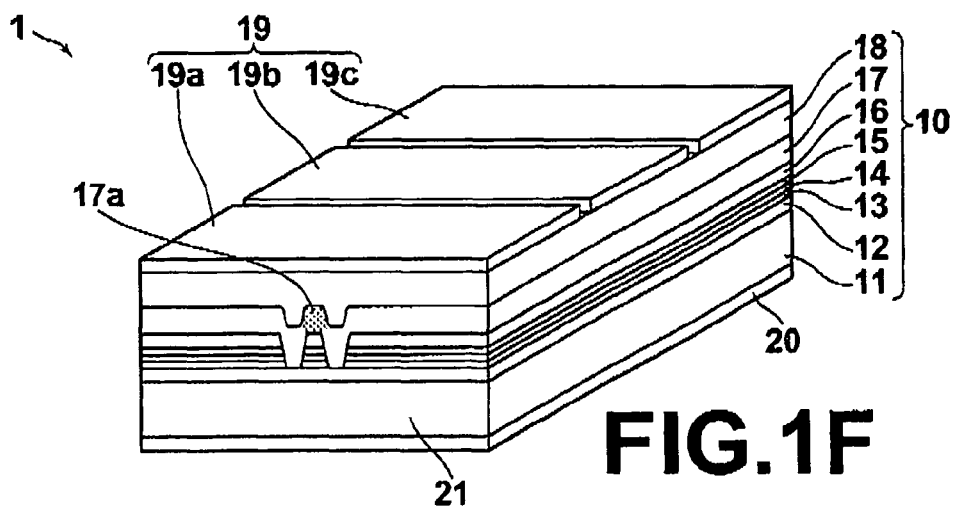
FIG. 1F is a perspective view that illustrates the semiconductor light emitting element according to the first embodiment of the present invention.

FIG. 1F illustrates the schematic structure of the semiconductor light emitting element 1 of the first embodiment. The semiconductor light emitting element 1 is of a structure in which the gain wavelength of an active layer changes continuously along a wave guiding direction of light. In the semiconductor light emitting element 1, an electrode layer 19 provided on the upper surface of a layered structure 10 is divided into three electrodes 19a, 19b, and 19c, which are insulated from each other. Each of the divided and insulated electrodes 19a, 19b, and 19c are capable of independently adjusting the amount of current injected thereby.

The specific structure and the method for producing the semiconductor light emitting element 1 will be described with reference to FIGS. 1A through 1E. An n-InGaP cladding layer 12 and an SiO$_2$ layer 23 are formed on an n type GaAs substrate 11 in a first crystal growth process. As illustrated in FIG. 1A, the SiO$_2$ layer 23 is formed in a tapered pattern. Using the tapered SiO$_2$ layer 23 as a mask, a GaAs optical waveguide layer 13, an InGaAs strained quantum well active layer 14, a GaAs optical waveguide layer 15, and a p-InGaP cladding layer 16 are selectively formed in a second crystal growth process, then the SiO$_2$ layer 23 is removed (refer to FIG. 1B). After the SiO$_2$ layer 23 is removed, an n-InGaP blocking layer 17 is formed on the entirety of the exposed surface, in a third crystal growth process (refer to FIG. 1C). Thereafter, a p-type dopant is injected into the portion of the n-InGaP blocking layer 17 positioned at the upper region of a stripe shaped active layer, to cause a stripe shaped portion 17a of the blocking layer 17 to be of the p-type (refer to FIG. 1D). Thereafter, a p-GaAs contact layer 18 is grown on the entirety of the exposed surface in a fourth crystal growth process, to form the layered structure 10 (refer to FIG. 1E). Thereafter, the p-type electrode layer 19 is formed on the contact layer 18, which is the upper surface of the layered structure 10, and an n-type electrode layer 20 is formed on the bottom surface of the substrate 11, which is the lower surface of the layered structure 10. As illustrated in FIG. 1F, the p-type electrode layer 19 comprises the three electrodes 19a, 19b, and 19c, which are separated in the axial direction of the stripe of the active layer. Masks may be provided at the divisions of the p-type electrode layer 19 prior to formation thereof in order to form the three electrodes 19a, 19b, and 19c. Alternatively, portions of the p-type electrode layer 19 may be removed after formation thereof across the entire surface of the contact layer 18.

In the method for producing the semiconductor light emitting element 1 described above, selective growth is performed, employing the SiO$_2$ layer 23 as a tapered mask. A property that growth is faster in regions adjacent to wider portions of the taper than in regions adjacent to narrower portions of the taper is utilized. By utilizing this property, the active layer can be formed such that the thickness of the stripe shaped region thereof, sandwiched between the tapers of the mask 23, gradually changes from a front facet 21 to a rear facet 22 of the semiconductor light emitting element 1. If the thickness of the active layer differs, the gain wavelength thereof also differs, and it is known that thinner active layers emit light having shorter wavelengths. By forming the active layer to gradually become thicker toward the rear facet 22, the semiconductor light emitting element 1 can be configured to have shorter gain wavelengths toward the front facet 21, which is the light emitting facet. This configuration is adopted because shorter wavelength light is absorbed by gain portions having longer wavelengths than itself. That is, this configuration is adopted to prevent light emitted from rearward portions from being absorbed along the waveguide path on the way to the front facet 21.

Figure 2:
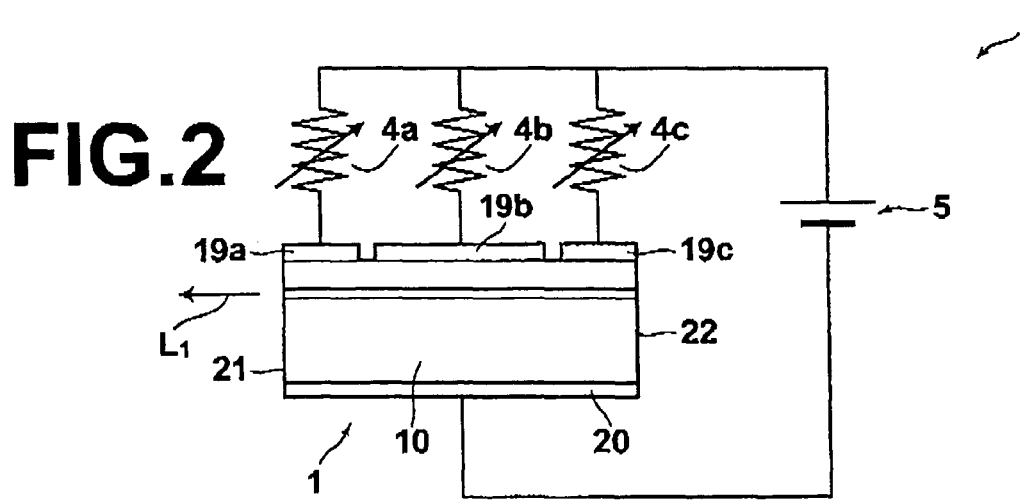
FIG. 2 is a schematic diagram that illustrates the construction of a light source apparatus that employs the semiconductor light emitting element according to the first embodiment of the present invention as a super luminescent diode.

FIG. 2 is a schematic diagram that illustrates the construction of a light source apparatus 2 that employs the semiconductor light emitting element 1 as a super luminescent diode.

The light source apparatus 2 comprises: the semiconductor light emitting element 1; a power source 5 for driving the semiconductor light emitting element 1; and three variable resistors 4a, 4b, and 4c, each of which is connected to each of the electrodes 19a, 19b, and 19c. The variable resistors 9a, 4b, and 4c are connected in parallel to the power source 5. That is, the electrodes 19a, 19b, and 19c are connected to the power source 5 via the variable resistors 4a, 4b, and 4c, respectively. The amount of current injected by each of the electrodes 19a, 19b, and 19c can be individually adjusted, by varying the resistance values of the variable resistors 4a, 4b, and 4c. The spectral distribution of output light $L_1$ emitted by the light source apparatus 2 can be shaped as desired, by adjusting the amounts of current injected by the electrodes 19a, 19b, and 19c, while observing the spectral distribution, which is displayed on a monitor.

Figure 3:
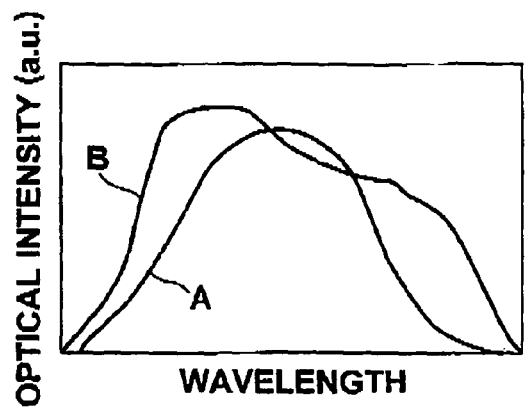
FIG. 3 is a graph that illustrates spectral distributions.
Figure 6:
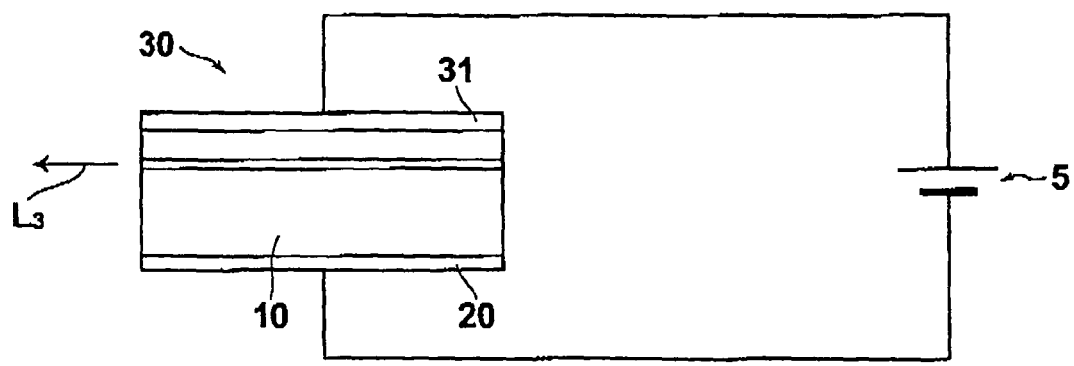
FIG. 6 is a schematic diagram that illustrates a conventional broad wavelength bandwidth semiconductor light emitting element.

FIG. 3 is a graph that illustrates the spectral properties of the SLD 1 of the present invention (curve A) and the spectral properties of a conventional SLD 30 having a single electrode structure (curve B). The conventional SLD 30 has the same semiconductor layers (layered structure 10), but a single undivided electrode 31 as the electrode layer on the upper surface, as illustrated in FIG. 6. Note that the spectral distribution of the output light $L_1$ emitted by SLD 1 of the present invention illustrated by curve A can be obtained by: initially setting the resistance of the three variable resistors 4a, 4b, and 4c to the same value; causing the same amount of current to be injected by the three electrodes 19a, 19b, and 19c to cause the SLD 1 to emit light; then gradually varying the resistance of each of the variable resistors while observing the spectral distribution such that the shape thereof becomes a Gaussian distribution.

As illustrated in FIG. 3, the spectral distribution of output light $L_3$ emitted by the conventional SLD 30 illustrated by curve B is asymmetric, with a peak in the shorter wavelength region. On the other hand, the spectral distribution of output light $L_1$ emitted by the SLD 1 of the present invention illustrated by curve A is a Gaussian distribution, obtained by adjusting the amount of current supplied to each electrode. That is, if the semiconductor light emitting element 1 of the present invention is employed, a Gaussian spectral distribution, which is ideal for light sources to be utilized in OCT, can be easily obtained.

Note that the spectral distribution is not limited to being shaped into a Gaussian spectral distribution, and any desired shape may be obtained. In addition, a greater number of shapes can be obtained, by increasing the number of separate electrodes provided in the wave guiding direction.

In the semiconductor light emitting element 1 according to the first embodiment, the three divided regions are set to three equal sized regions provided on the upper surface. However, it is not necessary for the regions to be of equal sizes. Further, a single power source 5 was employed to supply current to the three electrodes 19a, 19b, and 19c. Alternatively, a power source may be provided for each electrode.

Figure 4A:
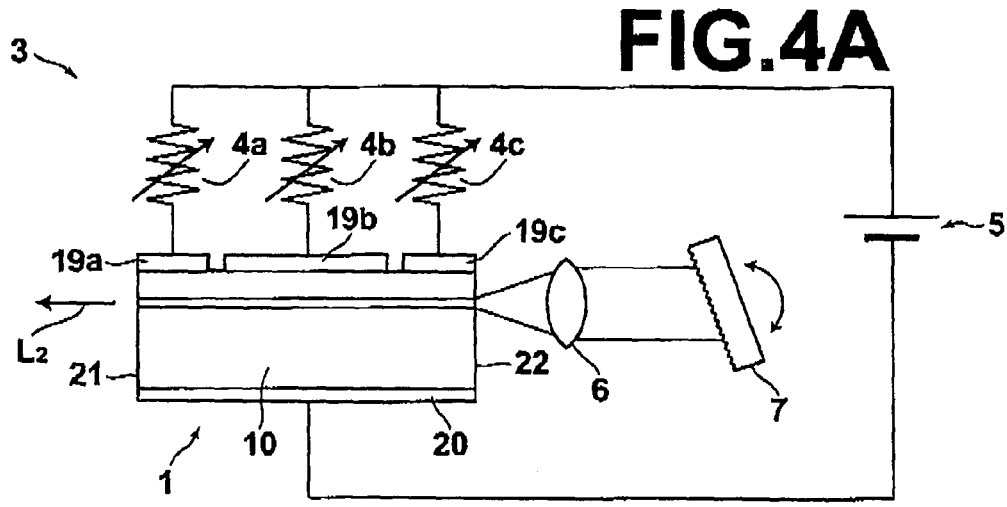
FIG. 4A is a schematic diagram that illustrates the construction of a light source apparatus configured as a variable wavelength laser that employs the semiconductor light emitting element of the present invention as an optical amplifier.

FIG. 4A is a schematic diagram that illustrates the construction of a light source apparatus 3 configured as a variable wavelength laser that employs the semiconductor light emitting element 1 as an optical amplifier.

The variable wavelength laser 3 comprises: the semiconductor light emitting element 1; a power source 5 for driving the semiconductor light emitting element 1; three variable resistors 4a, 4b, and 4c, each of which is connected to each of the electrodes 19a, 19b, and 19c; a lens 6 for collimating light emitted by the semiconductor light emitting element 1; a diffraction grating 7 for selectively returning a portion of the wavelength of light output from the semiconductor light emitting element 1 to the semiconductor light emitting element 1; and a driving section (not shown) for rotating the diffraction grating 7. The three variable resistors 4a, 4b, and 4c are connected to the power source 5 in parallel.

Generally, broad ranges of operation are desired in variable wavelength lasers. The semiconductor light emitting element 1 of the first embodiment has an active layer structured to generate light having different gain wavelengths. Therefore, the variable wavelength laser 3 is capable of operating within a range of approximately 100 to 200 nm, whereas a conventional semiconductor light emitting element having a constant gain wavelength can only obtain a range of operation of approximately 50 nm.

The semiconductor light emitting element 1 comprises the plurality of electrodes 19a, 19b, and 19c, provided in the wave guiding direction of light, and it is possible to individually set current values for each electrode. That is, the semiconductor light emitting element 1 is capable of varying the gain for each wavelength. Therefore, the spectral distribution of light emitted thereby can be shaped into a top hat shape, in which the output of light having different gain wavelengths can be made constant. Thereby, laser light $L_2$ having uniform output for each wavelength across the broad range of operation can be obtained.

Figure 4B:
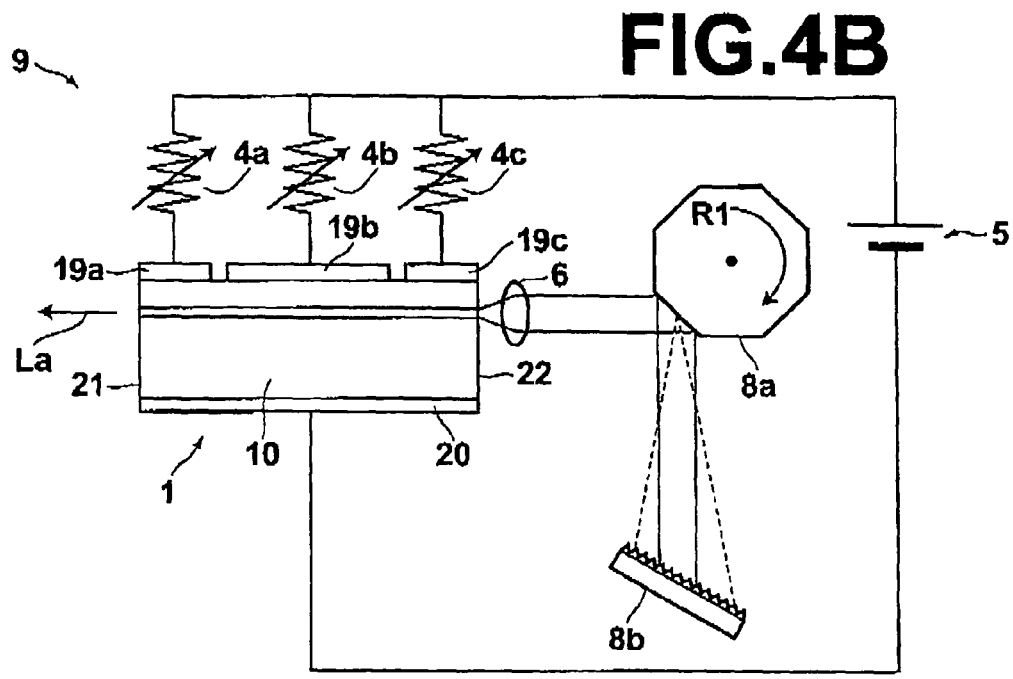
FIG. 4B is a schematic diagram that illustrates the construction of a light source apparatus configured as a wavelength sweeping variable wavelength laser that employs the semiconductor light emitting element of the present invention as an optical amplifier.

FIG. 4B is a schematic diagram that illustrates the construction of a light source apparatus 9 configured as a wavelength sweeping variable wavelength laser that employs the semiconductor light emitting element 1 as an optical amplifier. The variable wavelength laser 9 of FIG. 9B comprises a polygon mirror 8A and a diffraction grating 8, instead of the diffraction mirror 7 of the variable wavelength laser 3 of FIG. 4A.

Light emitted from the semiconductor light emitting element 1 is collimated by the lens 6, is reflected by the polygon mirror 8A, and enters the diffraction grating 8. Light scattered toward the incident direction (hereinafter, referred to as "returning light") from among the light scattered by the diffraction grating 8 is reflected by the polygon mirror 8A, and returns to the semiconductor light emitting element 1. A cavity is constituted by the light emitting facet of the semiconductor light emitting element 1 and the diffraction grating 8, and laser light $L_a$ is emitted from the light emitting facet of the semiconductor light emitting element 1. Note that the wavelength of the laser light $L_a$ is that of the returning light.

Here, the polygon mirror 8A rotates in the direction of arrow R1. The reflecting angle of each reflective surface changes continuously. Thereby, the angle of incidence of light that enters the diffraction grating 8B changes continuously, and as a result, the oscillating wavelength also changes continuously.

In the case that the polygon mirror 8A rotates in the direction of arrow R1 at a constant speed, the wavelength of the returning light will change with a uniform period accompanying the passage of time. For this reason, the variable wavelength laser 9 emits laser light $L_a$, of which the wavelength is swept at a constant period.

As in the variable wavelength laser 3, the semiconductor light emitting element 1 of the variable wavelength laser 9 comprises the plurality of electrodes 19a, 19b, and 19c, provided in the wave guiding direction of light, and it is possible to individually set current values for each electrode. That is, the semiconductor light emitting element 1 is capable of varying the gain for each wavelength. Therefore, the spectral distribution of light emitted thereby can be shaped into a top hat shape, in which the output of light having different gain wavelengths can be made constant. Thereby, laser light $L_a$ having uniform output for each wavelength across the broad range of operation can be obtained.

Figure 5:
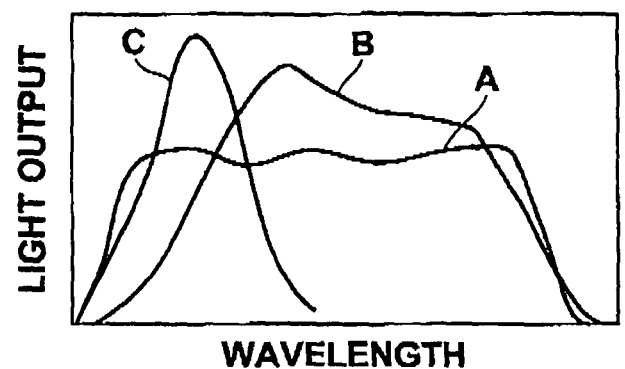
FIG. 5 is a graph that illustrates the relationship between wavelength and light output

FIG. 5 is a graph that illustrates the relationship between wavelength and light output, which is a wavelength variable property, for variable wavelength lasers, each equipped with: the semiconductor light emitting element 1 of the present invention (curve A); a conventional element 30 having a single electrode structure (curve B); and an element which has a constant gain wavelength across the entire region of the active layer thereof (curve C). The conventional element 30 has the same semiconductor layers (layered structure 10), but a single undivided electrode 31 as the electrode layer on the upper surface, as illustrated in FIG. 6.

The wavelength/light output properties of the variable wavelength lasers equipped with semiconductor light emitting elements having active layers structured to emit light of different gain wavelengths (illustrated by curve A and curve B) exhibit wider output bandwidths than that of the variable wavelength laser equipped with the element having a constant gain wavelength, by a factor or 1.5 to 2. In addition, as illustrated by curve A, the variable wavelength laser equipped with the semiconductor light emitting element 1 is capable of obtaining more uniform light output across a broad bandwidth, compared to that equipped with the element 30 having the single electrode structure.

As described above, a variable wavelength laser that has uniform output across a broad bandwidth can be configured, by utilizing the semiconductor light emitting element 1 of the first embodiment.

Note that the semiconductor light emitting element of the present invention may be applied to light sources in the fields of communications, measurement, medicine, printing, image processing and the like. Examples were described for cases in which the semiconductor light emitting element was employed as an SLD or as an optical amplifier within light source apparatuses. However, the present invention is not limited to the applications described above, and the semiconductor light emitting element ay be employed as an optical amplifier used in optical communications. The semiconductor light emitting element 1, which employs a GaAs substrate and emits light having wavelengths in the 1 μm band has been described as the first embodiment. Alternatively, the semiconductor light emitting element of the present invention may employ a GaN substrate and emit light having wavelengths in the 0.3 to 0.5 μm band. As a further alternative, the semiconductor light emitting element of the present invention may employ an InP substrate and emit light having wavelengths in the 1.3 to 1.6 μn band.

Figure 7:
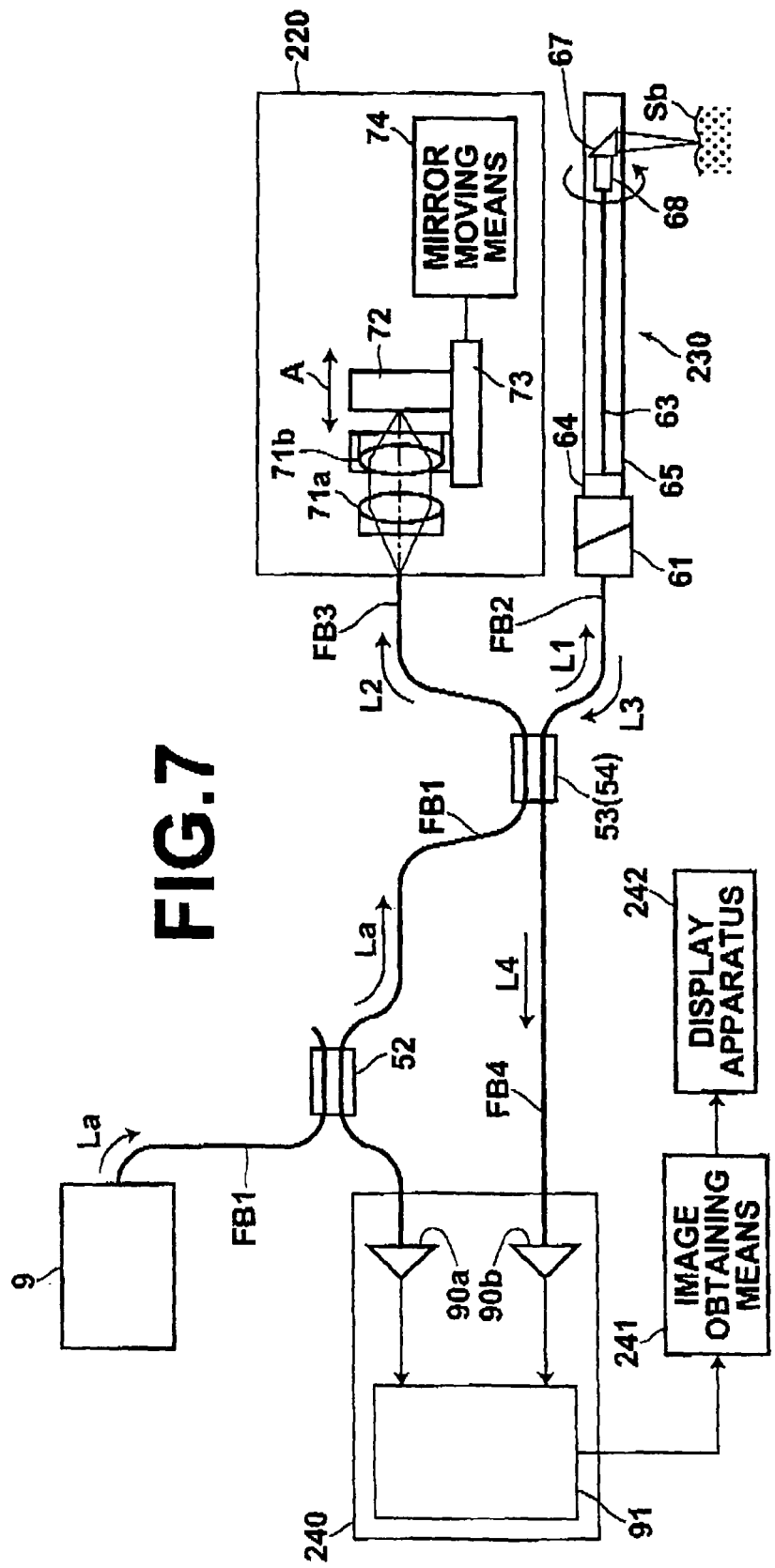
FIG. 7 is a schematic diagram that illustrates the construction of an optical tomography imaging apparatus.

Next, an optical tomography imaging apparatus 200 that employs the variable wavelength laser 9 of FIG. 4B will be described with reference to FIG. 7. The optical tomography imaging apparatus 200 emits swept wavelength coherent light from the light source; divides the coherent light into a measuring light beam and a reference light beam; multiplexes a reflected light beam, which is the measuring light beam reflected by a measurement target when the measuring light beam is irradiated onto the measurement target, and the reference light beam; and obtains tomographic images of the measurement target, based on the intensities of a coherent light beam obtained by multiplexing the reflected light beam and the reference light beam. FIG. 7 is a schematic diagram that illustrates the construction of the optical tomography imaging apparatus 200.

The optical tomography imaging apparatus 200 illustrated in FIG. 7 comprises: the variable wavelength laser 9, for emitting the laser light beam La while sweeping the wavelength thereof at a constant period; a light dividing means 53, for dividing the laser light beam La, which is emitted from the variable wavelength laser 9, into a measuring light beam L1 and a reference light beam L2; an optical path length adjusting means 220, for adjusting the optical path length of the reference light beam L2; an optical probe 230 that irradiates the measuring light beam L1 onto a measurement target Sb; a multiplexing means 54, for multiplexing a reflected light beam L3, which is the measuring light beam L1 reflected from the measurement target Sb, and the reference light beam L2; a coherent light detecting means 240, for detecting a coherent light beam L4, formed by multiplexing the reflected light beam L3 and the reference light beam L2; an image obtaining means 241, for generating an optical tomographic image of the measurement target Sb, based on the detection results of the coherent light detecting means 240; and a display apparatus 242, for displaying the optical tomographic image.

The variable wavelength laser 9 emits the laser light beam $L_a$ while sweeping the wavelength thereof such that the wavelength $\lambda_c$ is within a range of 950 nm-1150 nm.

The light dividing means 53 is constituted by a 2×2 optical fiber coupler, for example. The light dividing means 53 functions to divide the light beam $L_a$, emitted by the light source unit 210 and guided through an optical fiber FB1, into the measuring light beam L1 and the reference light beam L2. The light dividing means 53 is optically connected to optical fibers FB2 and FB3. The measuring light beam L1 is guided through the optical fiber FB2, and the reference light beam L2 is guided through the optical fiber FB3. Note that the light dividing means 53 of the present embodiment also functions as the multiplexing means 54.

The optical fiber FB2 is optically connected to the optical probe 230, and the measuring light beam is guided through the optical fiber FB2 to the optical probe 230. The optical probe 230 is to be inserted into body cavities via a forceps opening and a forceps channel, and is removably mounted to the optical fiber FB2 with an optical connector 61.

The optical probe 230 comprises: a probe outer cylinder 65, which has a closed distal end; a single optical fiber 63, which is provided to extend along the axial direction of the outer cylinder 65 within the interior space thereof; a prism mirror 67, for deflecting a light beam L emitted from the distal end of the optical fiber 63; a rod lens 68, for condensing the light beam L such that it converges on the measurement target Sb, which surrounds the outer cylinder 65; and a motor 64, for rotating the optical fiber 63 with its optical axis as the rotational axis. Note that the rod lens 68 and the prism mirror 67 are provided so as to rotated along with the optical fiber.

The optical path length adjusting means 220 is provided at the reference light beam L2 emitting side of the optical fiber F133. The optical path length adjusting means 220 adjusts the optical path length of the reference light beam L2 to adjust the position at which obtainment of tomographic images is initiated. The optical path length adjusting means 220 comprises: a mirror 72, for reflecting the reference light beam L2 emitted from the optical fiber FB3; a first optical lens 71a, which is provided between the mirror 72 and the optical fiber FB3; and a second optical lens 71b, which is provided between the first optical lens 71a and the mirror 72.

The first optical lens 71a functions to collimate the reference light beam L2, which is emitted from the core of the optical fiber FB3, and also functions to focus the reference light beam L2, which is reflected by the mirror 72, onto the core of the optical fiber 153. The second optical lens 71b functions to focus the reference light beam L2, which is collimated by the first optical lens 71a, onto the mirror 72, and also functions to collimate the reference light beam L2, which is reflected by the mirror 72. That is, the first optical lens 71a and the second optical lens 71b form a confocal optical system.

Accordingly, the reference light beam L2 emitted from the optical fiber FB3 is collimated by the first optical lens 71a, and focused onto the mirror 72 by the second optical lens 71b. Thereafter, the reference light beam L2 reflected by the mirror 72 is collimated by the second optical lens 71b, and focused onto the core of the optical fiber FB3 by the first optical lens 71a.

The optical path length adjusting means 220 further comprises; a base 73, on which the second optical lens 71b and the mirror 72 are fixed; and a mirror moving means 74, for moving the base 73 in the direction of the optical axis of the first optical lens 71a. The optical path length of the reference light beam L2 is varied by moving the base 73 in the directions indicated by arrow A.

The multiplexing means 54 is constituted by the aforementioned 2×2 optical fiber coupler. The multiplexing means 59 multiplexes the reference light beam L2, of which the optical path length has been adjusted by the optical path length adjusting means 220, and the reflected light beam L3 reflected by the measurement target Sb. The multiplexed coherent light beam L9 is emitted toward the coherent light detecting means 240 via the optical fiber FB4.

The coherent light detecting means 240 detects the coherent light beam L4, and measures the intensity thereof. Note that in the optical tomography imaging apparatus 200, the coherent light beam L4 is divided into two light beams by the light divided means 3, and balanced detection of the divided light beams is performed by photodetectors 90a and 90b, respectively.

The image obtaining means 291 administers Fourier transform on the coherent light beam L9 detected by the coherent light detecting means 290, to calculate the intensity of the reflected light beam L3 at each depth position within the measurement target Sb. Thereby, tomographic images of the measurement target Sb are obtained. The obtained tomographic images are displayed by the display apparatus 242.

Hereinafter, the operation of the optical tomography imaging apparatus 200 having the above construction will be described. When obtaining a tomographic image, first, the base 73 is moved in the direction of arrow A, to adjust the optical path length such that the measurement target Sb is positioned within a measurable region. Thereafter, the light beam $L_a$ is emitted from the variable wavelength laser 9. The light beam $L_a$ is divided into the measuring light beam L1 and the reference light beam L2 by the light dividing means 53. The measuring light beam L1 is emitted within the body cavity from the optical probe 230, and irradiated on the measurement target Sb. At this time, the measuring light beam L1 scans the measurement target Sb one dimensionally, by the optical probe 230 operating as described above. The reflected light beam L3, reflected by the measurement target Sb, is multiplexed with the reference light beam L2, reflected by the mirror 72, to form the coherent light beam L4. The coherent light beam L4 is detected by the coherent light detecting means 240.

Here, detection of the coherent light beam L4 by the coherent light detecting means 240 and image generation by the image obtaining means 291 will be described briefly. Note that a detailed description of these two points can be found in M. Takeda, "Optical Frequency Scanning Interference Microscopes", Optics Engineering Contact, Vol. 41, No. 7, pp. 426-432, 2003.

When the measuring light beam L1 is irradiated onto the measurement target Sb, the reflected light beams L3, which are reflected at various depths within the measurement target Sb, and the reference light beam L2 interfere with each other, with various optical path length differences. By designating the optical intensity of the interference pattern with respect to each of the optical path length differences l as S(l), the optical intensity I(k) detected by the coherent light detecting means 290 can be expressed as:

$$I(k)=\int_0^\infty S(l)[1+\cos(kl)]dl$$

wherein:
k: wave number
l: optical path length difference

The above formula may be considered as being provided as an interferogram of an optical frequency range, in which the wave number k=ω/c is a variable. For this reason, the image obtaining means 241 administers Fourier transform on the spectral interference pattern detected by the coherent light detecting means 240, to determine the optical intensity S(I) of the coherent light beam L4. Thereby, data regarding the distance from a measuring position within the measurement target Sb and data regarding the intensity of the reflected light beam can be obtained, and generation of tomographic images is enabled. The generated tomographic images are displayed on the display apparatus 242.

The optical tomography imaging apparatus 200 obtains tomographic images employing laser light emitted by a light source apparatus that operates as a variable wavelength laser capable of obtaining substantially uniform optical intensities for various wavelengths. Therefore, favorable tomographic images can be obtained.

Note that a Michaelson type interferometer is employed in the optical tomography imaging apparatus 200. However, the interferometer is not limited to the Michaelson type. Other types of interferometers, such as those of the Mach-Zehnder type and those of the Fizeau type, may alternatively be employed.

There are two types of known OCT apparatuses. One type of OCT apparatus obtains optical tomographic images by employing swept wavelength coherent light, as in the optical tomography imaging apparatus 200. The other type of OCT apparatus obtains optical tomographic images by employing low coherence light. The light source illustrated in FIG. 2, in which the semiconductor light emitting element of the present invention is employed as an SLD, may be utilized as the light source for the latter type of OCT apparatus.

What is claimed is:

1. A semiconductor light emitting element, comprising:
a layered structure that includes an active layer;
an upper electrode layer on the upper surface of the layered structure; and
a lower electrode layer on the lower surface of the layered structure; wherein:
at least one of the upper electrode layer and the lower electrode layer is divided into at least two electrodes, which are separated in a wave guiding direction of light;
the active layer is structured to have different gain wavelengths along the wave guiding direction, to emit light having different spectra from each region corresponding to each of the at least two electrodes; and
the spectral distribution of output light is enabled to be varied by individually varying the current injected by each of the at least two divided electrodes.

2. A semiconductor light emitting element as defined in claim 1, wherein:
the structures having different gain wavelengths are configured such that the gain wavelengths become shorter along the wave guiding direction toward the light emitting facet.

3. A semiconductor light emitting element as defined in claim 1, wherein:
the semiconductor light emitting element is employed as a super luminescent diode.

4. A semiconductor light emitting element as defined in claim 2, wherein:
the semiconductor light emitting element is employed as a super luminescent diode.

5. A semiconductor light emitting element as defined in claim 1, wherein:
the semiconductor light emitting element is employed as an optical amplifier.

6. A semiconductor light emitting element as defined in claim 2, wherein:
the semiconductor light emitting element is employed as an optical amplifier.

7. A light source apparatus, comprising:
a semiconductor light emitting element as defined in claim 1; and
drive means, which is capable of individually adjusting the current to be injected by each of the at least two divided electrodes of the semiconductor light emitting element.

8. A light source apparatus, comprising:
a semiconductor light emitting element as defined in claim 2; and
drive means, which is capable of individually adjusting the current to be injected by each of the at least two divided electrodes of the semiconductor light emitting element.

9. A light source apparatus as defined in claim 7, wherein the drive means comprises:
a power source for driving the semiconductor light emitting element; and
at least two variable resistors, each of which is connected to each of the at least two divided electrodes, connected in parallel to the power source.

10. A light source apparatus as defined in claim 8, wherein the drive means comprises:
a power source for driving the semiconductor light emitting element; and
at least two variable resistors, each of which is connected to each of the at least two divided electrodes, connected in parallel to the power source.

11. A light source apparatus as defined in claim 7 to be employed as a variable wavelength laser, further comprising:
wavelength selecting means that selectively returns a portion of the wavelength of light output from the semiconductor light emitting element to the semiconductor light emitting element.

12. A light source apparatus as defined in claim 8 to be employed as a variable wavelength laser, further comprising:
wavelength selecting means that selectively returns a portion of the wavelength of light output from the semiconductor light emitting element to the semiconductor light emitting element.

13. A light source apparatus as defined in claim 11, wherein;
the wavelength selecting means is a wavelength sweeping means that selectively returns a portion of the wavelength of light output from the semiconductor light emitting element to the semiconductor light emitting element while continuously varying the wavelength at a predetermined period.

14. A light source apparatus as defined in claim 12, wherein:
the wavelength selecting means is a wavelength sweeping means that selectively returns a portion of the wavelength of light output from the semiconductor light emitting element to the semiconductor light emitting element while continuously varying the wavelength at a predetermined period.

15. An optical tomography imaging apparatus, comprising:
a light source apparatus as defined in claim 13;
light dividing means, for dividing laser light emitted by the light source apparatus into a measuring light beam and a reference light beam;
multiplexing means, for multiplexing a reflected light beam, which is the measuring light beam reflected by a measurement target when the measuring light beam is irradiated onto the measurement target, and the reference light beam;
coherent light detecting means, for detecting the intensity of the reflected light beam at a plurality of depth positions of the measurement target, based on the frequency and the optical intensity of a coherent light beam obtained by multiplexing the reflected light beam and the reference light beam; and
image obtaining means, for obtaining tomographic images of the measurement target, based on the intensities of the reflected light beam at each of the depth positions detected by the coherent light detecting means.

16. An optical tomography imaging apparatus, comprising:
a light source apparatus as defined in claim 14;
light dividing means, for dividing laser light emitted by the light source apparatus into a measuring light beam and a reference light beam;
multiplexing means, for multiplexing a reflected light beam, which is the measuring light beam reflected by a measurement target when the measuring light beam is irradiated onto the measurement target, and the reference light beam;
coherent light detecting means, for detecting the intensity of the reflected light beam at a plurality of depth positions of the measurement target, based on the frequency and the optical intensity of a coherent light beam obtained by multiplexing the reflected light beam and the reference light beam; and
image obtaining means, for obtaining tomographic images of the measurement target, based on the intensities of the reflected light beam at each of the depth positions detected by the coherent light detecting means.

* * * * *